(12) United States Patent
Chang et al.

(10) Patent No.: US 6,288,401 B1
(45) Date of Patent: Sep. 11, 2001

(54) ELECTROSTATIC ALIGNMENT OF A CHARGED PARTICLE BEAM

(75) Inventors: Tai-Hon P Chang, Foster City; Marian Mankos, San Francisco; Lawrence P Muray, Moraga, all of CA (US); Ho-Seob Kim, Asan (KR); Kim Y Lee, Fremont, CA (US)

(73) Assignee: Etec Systems, Inc., Santa Clara, CA (US)

(*) Notice: Subject to any disclaimer, the term of this patent is extended or adjusted under 35 U.S.C. 154(b) by 0 days.

(21) Appl. No.: 09/364,777

(22) Filed: Jul. 30, 1999

(51) Int. Cl.⁷ .................. G21K 1/08; H01J 3/14
(52) U.S. Cl. ................................. 250/396 R
(58) Field of Search ................. 250/309, 305, 250/310, 396 R; 378/119; 347/123

(56) References Cited

U.S. PATENT DOCUMENTS

| | | |
|---|---|---|
| 2,547,994 | 4/1951 | Bertein . |
| 3,358,174 | 12/1967 | Glenn . |
| 3,548,250 | 12/1970 | Roosmalen et al. . |
| 3,555,347 | 1/1971 | Dickinson . |
| 3,694,687 | 9/1972 | Glenn . |
| 4,564,758 | * 1/1986 | Slodzian et al. ............... 250/309 |
| 5,054,046 | * 10/1991 | Shoulders ..................... 378/119 |
| 5,122,663 | 6/1992 | Chang et al. .................. 250/310 |
| 5,155,412 | 10/1992 | Change et al. ................ 315/14 |
| 5,450,103 | * 9/1995 | Kubelik ......................... 347/123 |
| 5,502,306 | * 3/1996 | Meisburger et al. .......... 250/310 |
| 5,838,004 | * 11/1998 | Tiemeijer et al. ............. 250/305 |

FOREIGN PATENT DOCUMENTS

| | | |
|---|---|---|
| 32 05 027 | 8/1983 | (DE) . |
| 58 192254 | 9/1983 | (JP) . |
| 03 283245 | 12/1991 | (JP) . |
| WO 00 24030 | 4/2000 | (WO) . |

OTHER PUBLICATIONS

Chang, et al., "Electron–beam microcolumns for lithography and related application", J. Vac. Sci. Technol. B 14(6), pp. 3774–3781, Nov./Dec. 1996.

Thomson, et al., "Lens and deflector design for microcolumns", J. Voc. Sci. Technol. B 13(6), pp. 2445–2449, Nov./Dec. 1995.

Kim, et al., "Miniature Schottky electron source", J. Vac. Sci. Technol. B 13(6), pp. 2468–2472, Nov./Dec. 1995.

Chang, et al., "Electron beam microcolumn technology and applications", SPIE vol. 2522, pp. 4–12, Jul. 10–14, 1995.

Chang, et al., "Electron beam technology—SEM to microcolumn", Micro9electronic engineering, 32, pp. 113–130, 1996.

* cited by examiner

*Primary Examiner*—Jack Berman
*Assistant Examiner*—Johnnie L Smith, II
(74) *Attorney, Agent, or Firm*—Kenneth C. Brooks

(57) ABSTRACT

A field emission source produces a charged particle beam that can be electrostatically aligned with the optical axis. Quadrupole (or higher multipole) centering electrodes approximately centered on the optical axis are placed between the emitter and the extraction electrode. By applying centering potentials of equal amplitude and opposite polarity on opposing elements of the centering electrodes, an electrostatic deflection field is created near the optical axis. The electrostatic deflection field aligns the charged particle beam with the optical axis thereby obviating the need to mechanically align the emitter with the optical axis. A second set of centering electrodes may be used to deflect the charged particle beam back and to ensure that the charged particle beam is parallel with the optical axis. Further, the extraction electrode may be split into a quadrupole arrangement with the extraction and centering potentials superimposed.

20 Claims, 4 Drawing Sheets

ELECTROSTATIC ALIGNMENT OF A CHARGED PARTICLE BEAM

FIELD OF THE INVENTION

The present invention relates to a field emission source used, for example, in an electron beam microcolumn, and in particular to the electrostatic alignment of a charged particle beam.

BACKGROUND

Miniature electron beam microcolumns ("microcolumns") are based on microfabricated electron "optical" components and field emission sources operating under principles similar to scanning tunneling microscope ("STM") aided alignment principles. Field emission sources are bright electron sources that are very small, making them ideal for use in microcolumns. One type of field emission source is a Schottky emitter, such as the type discussed in "Miniature Schottky Electron Source," H. S. Kim et al., Journal of Vacuum Science Technology Bulletin 13(6), pp. 2468–72, November/December 1995 incorporated herein by reference. For additional field emission sources and for information relating to microcolumns in general, see the following publications and patents: "Experimental Evaluation of a 20×20 mm Footprint Microcolumn," by E. Kratschmer et al., Journal of Vacuum Science Technology Bulletin 14(6), pp. 3792–96, November/December 1996; "Electron Beam Technology-SEM to Microcolumn," by T. H. P. Chang et al., Microelectronic Engineering 32, pp. 113–130, 1996; "Electron-Beam Microcolumns for Lithography and Related Applications," by T. H. P. Chang et al., Journal of Vacuum Science Technology Bulletin 14(6), pp. 3774–81, November/December 1996; "Electron Beam Microcolumn Technology And Applications," by T. H. P. Chang et al., Electron-Beam Sources and Charged-Particle Optics, SPIE Vol. 2522, pp. 4–12, 1995; "Lens and Deflector Design for Microcolumns," by M. G. R. Thomson and T. H. P. Chang, Journal of Vacuum Science Technology Bulletin 13(6), pp. 2445–49, November/December 1995; U.S. Pat. No. 5,122,663 to Chang et al.; and U.S. Pat. No. 5,155,412 to Chang et al., all of which are incorporated herein by reference.

FIG. 1 shows a schematic cross sectional view of a conventional field emission source 10, which includes an electron emitter 12 and an extraction electrode 14. The electron emitter 12 is a Schottky emitter with a tungsten tip 16 serving as a cathode, which is spot welded on a filament 18. The filament 18 is mounted on two rods 20, which are held by a base 22, and is surrounded by a suppressor cap 24.

The extraction electrode 14 defines a center aperture 15. The aperture 15 and following (downstream) lenses (not shown) in the microcolumn define the optical axis 26 for the field emission source 10.

By applying a voltage Vc to the tip 16 and a voltage Ve to the extraction electrode 14, a resulting electric field causes the emission of electrons from tip 16. A voltage Vs applied to the suppressor cap 24 suppresses undesired thermionic electrons.

An important consideration in the field emission source 10 is that the electron emitter 12 is aligned with the optical axis 26. Because the diameter of aperture 15 is typically 1–2 $\mu$m (micrometers), a small misalignment, e.g., 1 $\mu$m, will result in a large off-axis aberration and an undesirable increase in the total spot size. Thus, a small misalignment can severely deteriorate the performance of a microcolumn. Conventionally, to ensure proper alignment, the electron emitter 12 is mechanically aligned with the optical axis 26.

Thus, electron emitter 12 is physically moved, as indicated by arrows 28, by the use of, e.g., alignment screws, a micrometer x-y stage, a piezoelectric stage, or a scanning tunneling microscope (STM) like positioner to align position electron emitter 12 with optical axis 26. Unfortunately, mechanical alignment is difficult to achieve and is difficult to maintain over extended periods of time due to drift problems.

Thus, there is a need for a field emission source that can be easily aligned with the optical axis.

SUMMARY

A field emission source in accordance with the present invention produces a charged particle beam that is electrostatically aligned with the optical axis. The field emission source includes a charged particle emitter, such as a Schottky or cold-field emitter. Centering electrodes define an aperture through which a beam of charged particles from the emitter passes and which is approximately centered on the optical axis. The centering electrodes provide an electrostatic deflection field near the optical axis that aligns the beam of charged particles with the optical axis, i.e., the axis of the electron beam passes through the center of the next lens down stream. Thus the emitter need not be precisely aligned mechanically with the optical axis.

The center electrodes may be, for example, a quadrupole (or higher multipole) arrangement of electrodes placed between the emitter and an extraction electrode. By applying centering potentials of equal amplitude and opposite polarity on opposing elements of the centering electrodes, an electrostatic deflection field is created near the optical axis. The electrostatic deflection field aligns the charged particle beam with the optical axis thereby obviating the need to mechanically align the emitter with the optical axis. A second set of centering electrodes may be used to further deflect the charged particle beam and to ensure that the charged particle beam is approximately parallel with the optical axis. The centering electrodes may be integrally formed on the extraction electrode with an insulating layer between the extraction electrode and the centering electrodes and between the first set of centering electrodes and the second set of centering electrodes if a second set is used.

In another embodiment, the extraction electrode is split into a quadrupole (or higher multipole) arrangement. The extraction potential and the centering potentials are then superimposed.

DETAILED DESCRIPTION

Figure 1:
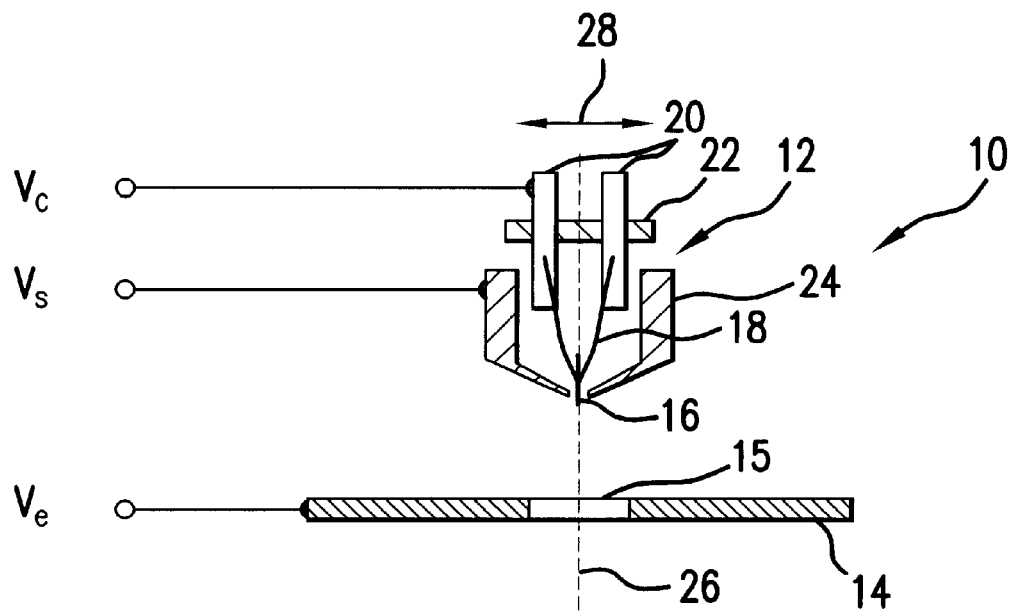
FIG. 1 shows a schematic cross sectional view of a conventional field emission source, which includes an electron emitter that is mechanically aligned with the optical axis as shown by arrow 28.
Figure 2:
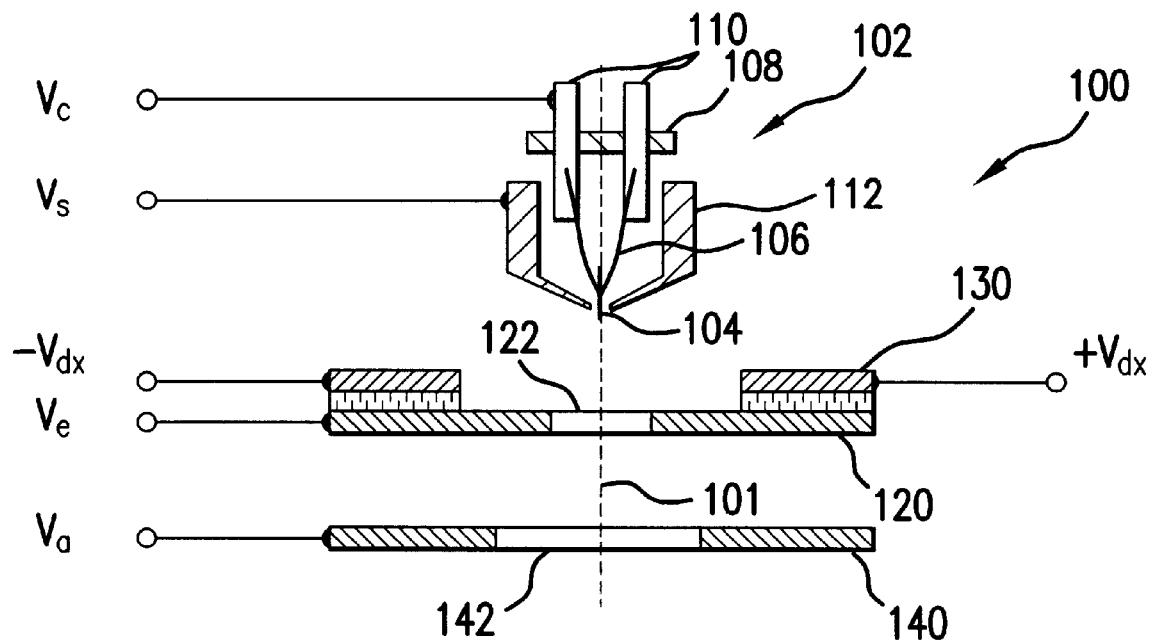
FIG. 2 shows a schematic cross sectional view of a field emission source including centering electrodes to electrostatically aligned an electron beam the optical axis in accordance with an embodiment of the present invention.

FIG. 2 shows a schematic cross sectional view of a field emission source 100, with an electron emitter 102 and an extraction electrode 120 and including centering electrodes 130 to electrostatically align an electron beam with the optical axis 101 in accordance with an embodiment of the present invention.

The electron emitter 102 is a Schottky emitter with an etched single crystal tungsten tip 104, approximately 50–100 μm in diameter, that is spot-welded on a filament 106 such as a tungsten wire, approximately 50–100 μm in diameter. The filament 106 is mounted on a support structure, which includes a base 108, two rods 110, and a suppressor cap 112. The filament 106 is connected to the rods 110, which is supported by the base 106. Electron emitter 102 may also be a cold-field emitter as is well known in the art.

The electron emitter 102 is mounted in front (upstream) of the extraction electrode 120. The extraction electrode 120 defines a center aperture 122, which is approximately 1–2 μm diameter. Following extraction electrode 120 are the conventional lens structures of the microcolumn, which for the sake of simplicity are shown as a single lens electrode 140 defined by a lens aperture 142. The optical axis 101 is centered on the extraction electrode aperture 122 and the lens aperture 142.

The field emission source 100 electrostatically corrects any misalignment between the electron emitter 102 and the optical axis 101. Thus, the electron emitter 102 may be rigidly mounted with respect to optical axis 101 and only a coarse physical prealignment of the electron emitter 102 with the extraction electrode 120 is necessary. The prealignment is mechanically performed, for example, using a conventional flexure stage or inertial walker during assembly. Advantageously, the electrostatic alignment in accordance with the present invention aligns the electron beam with the optical axis with the same or greater precision as with the conventional mechanical alignment. Thus, the necessity of extremely precise mechanical alignment is obviated.

Figure 3:
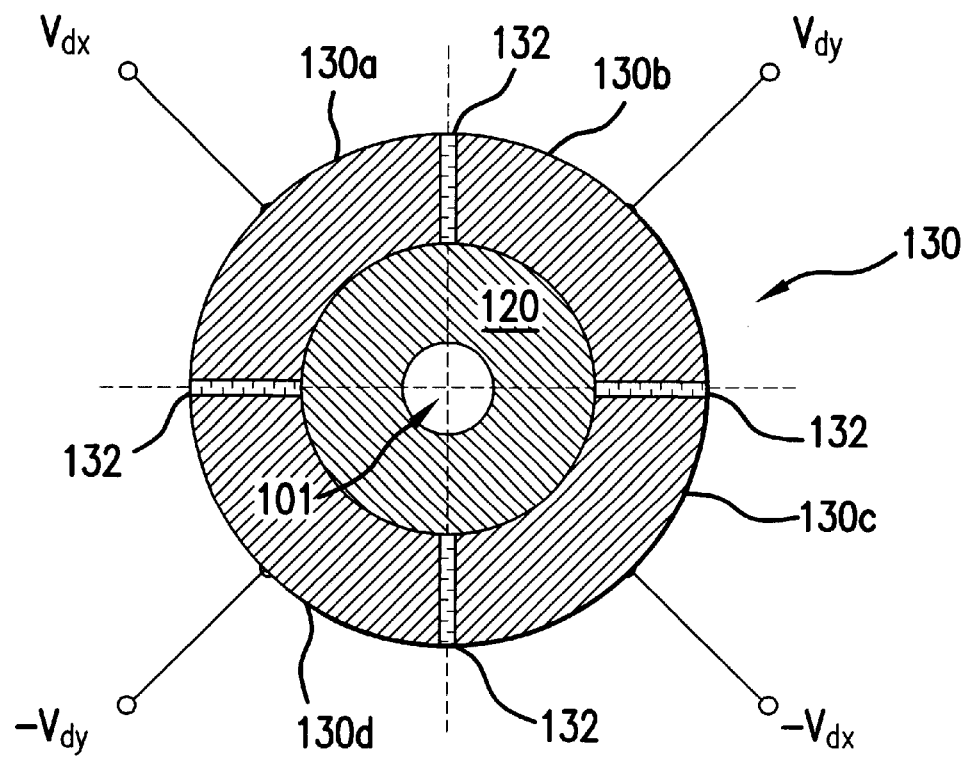
FIG. 3 shows a top view of the extraction electrode and centering electrodes.

In accordance with one embodiment of the present invention, the electrostatic alignment is achieved by electrostatic centering electrodes 130 positioned between the electron emitter 102 and the extraction electrode 120. FIG. 3 shows a top (plan) view of the extraction electrode 120 and electrostatic centering electrodes 130. As shown in FIG. 3, the centering electrodes 130 are in a quadrupole arrangement with electrode elements 130a, 130b, 130c, and 130d and approximately centered on optical axis 101. It should be understood that centering electrodes 130 may be a higher number multipole arrangement, e.g., an octopole or dodecapole.

The centering electrodes 130 are fabricated using the same micromachining technology used to fabricate lens components in a microcolumn, as is well understood by those of ordinary skill in the art. An electrically insulating layer 132 is deposited over the extraction electrode 120. The insulating layer 132 is for example silicon dioxide, pyrex, or a similar material and is 0.5 to 20 μm thick. A conductive layer, such as aluminum, gold, silicon (that is heavily n doped), copper, platinum, or other conductive material, is then deposited over the insulating layer 132 to a thickness of 1–100 μm. The conductive layer is then lithographically patterned and etched to form the desired centering electrodes 130. The deposition, patterning and etching of a conductive layer is well understood by those of ordinary skill in the art.

To cause the emission of electrons, a voltage Vc is applied to the rods 110 of the electron emitter 102, while a voltage Vs is applied to the suppressor cap 112, and a voltage Ve is applied to the extraction electrode 120. The difference in potentials between the electron emitter 102 and the extraction electrode 120 (Vc-Ve) creates a strong electric field in the area of the tip 104, causing the emission of electrons. The temperature of the tip 104 is regulated to approximately 1700 to 1800 degrees K by a current passing through the filament 106, and the average power is 1.5–2.0 W.

Potentials are applied to the individual centering electrode elements 130a, 130b, 130c, and 130d to form a deflection field near the optical axis 101. The deflection field approximately centers the emitted electron beam with respect to the optical axis, i.e., the axis of the electron beam passes through the center of the next lens down stream. Potentials of equal amplitude and opposite polarity are applied to opposite electrodes. Thus, for example, electrode element 130a will be at a voltage Vdx while electrode element 130c will be at a voltage −Vdx. Similarly, electrode element 130b will be at a voltage Vdy while electrode element 130d will be at a voltage −Vdy. The typical voltages used on the electrode elements range from a few tens of volts to a few hundred volts. If the electron emitter 102 is properly aligned with optical axis 101 and thus no centering potential is necessary, a uniform bias potential Vb may be applied to all individual electrode elements so that a uniform extraction field is preserved.

Figure 4:
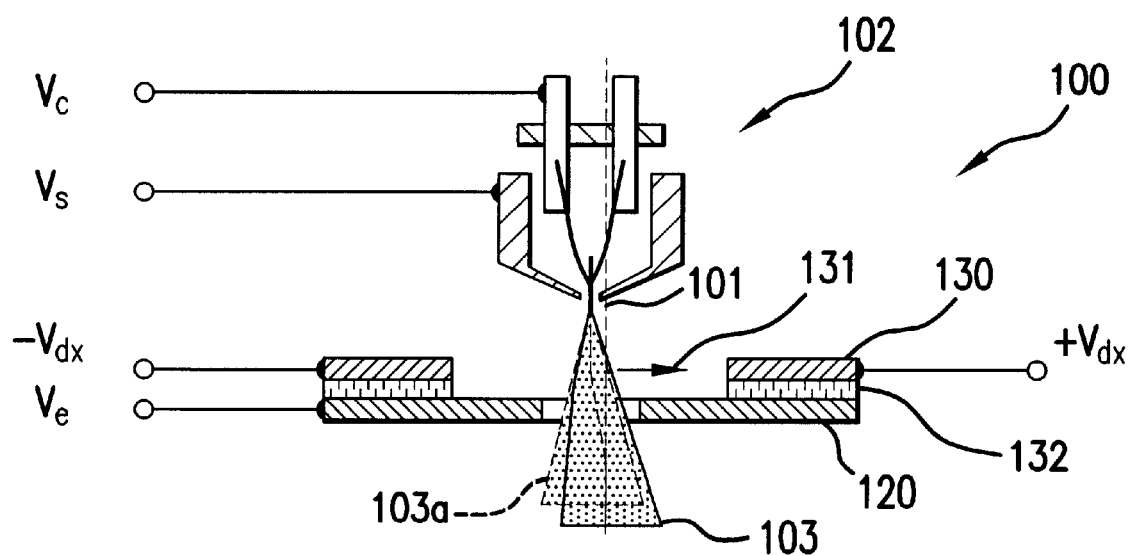
FIG. 4 shows a schematic cross sectional view of the correction of an electron beam produced by a misaligned field emission source in accordance with the present invention.

FIG. 4 shows a schematic cross sectional view of a misaligned field emission source 100 producing an electron beam 103 while centering electrodes 130 electrostatically align the electron beam 103 with the optical axis 101. As shown in FIG. 4, without the centering potential produced by centering electrodes 130, an electron beam would be misaligned with the optical axis (as indicated by the broken lines 103a). By application of centering potential on centering electrodes 130, an electrostatic deflection field is generated (as indicated by arrow 131), which deflects the electron beam 103 so that it is in approximate alignment with the optical axis 101, i.e., the axis of the electron beam passes through the center of the next lens down stream (not shown in FIG. 4).

The centering process may result in a small tilt of the electron beam 103 with respect to the optical axis 101, as shown in FIG. 4. The centering systems in the lenses that follow the extraction electrode 120, e.g., lens 140 shown in FIG. 2, may compensate for any residual tilt.

Figure 5:
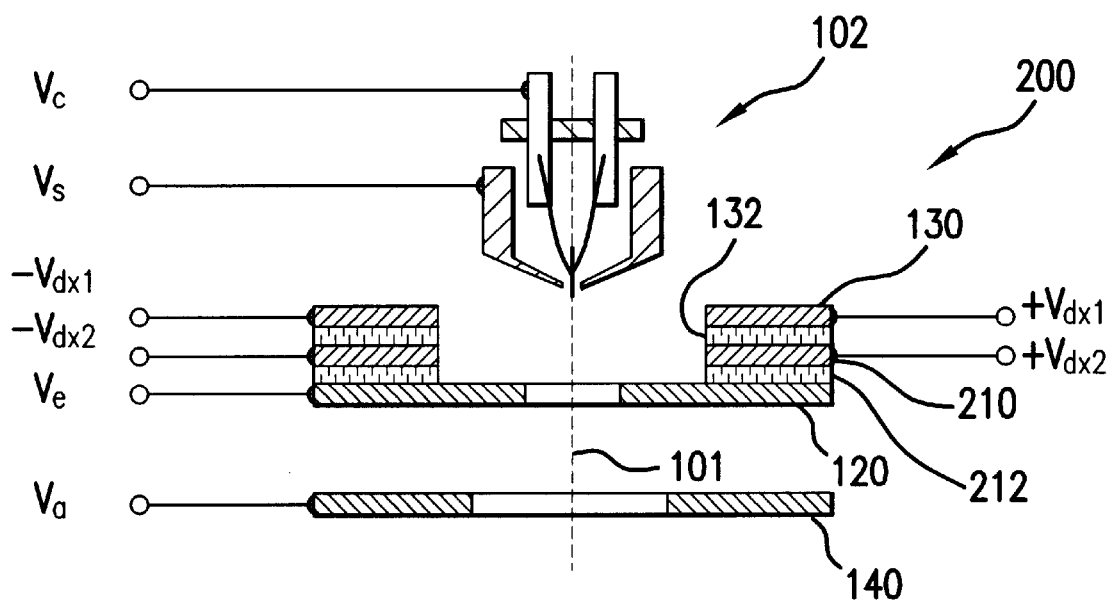
FIG. 5 shows a schematic cross sectional view of a field emission source with two sets of centering electrodes in accordance with another embodiment of the present invention.

FIG. 5 shows a schematic cross sectional view of a field emission source 200 in accordance with another embodiment of the present invention. Field emission source 200 is similar to field emission source 100, shown in FIG. 2, like designated elements being the same, however, field emission source 200 includes a second set of electrostatic centering electrodes 210 follow centering electrodes 130. The second set of centering electrodes 210 are similar in fabrication and operation to centering electrodes 130. The second set of centering electrodes 210 are used to allow simultaneous beam translation and parallelism to the optical axis thereby removing the residual tilt generated by centering electrodes 130 (which is illustrated in FIG. 4).

Centering electrodes 210 are fabricated in a manner similar to centering electrodes 130. An insulating layer 212 of approximately 0.5 to 20 $\mu$m is deposited over the extraction electrode 120. A conductive layer that forms the second set of centering electrodes 210 is deposited over the insulating layer 212. Another insulating layer 130, similar to insulating layer 212 is then deposited followed by another conductive layer that forms the first set of centering electrodes 130. The stack of conductive layers and insulating layers is then lithographically patterned and etched to define the desired centering electrodes 130 and second set of centering electrodes 210. Of course, if desired additional sets of centering electrodes may be produced in a similar manner.

Figure 6:
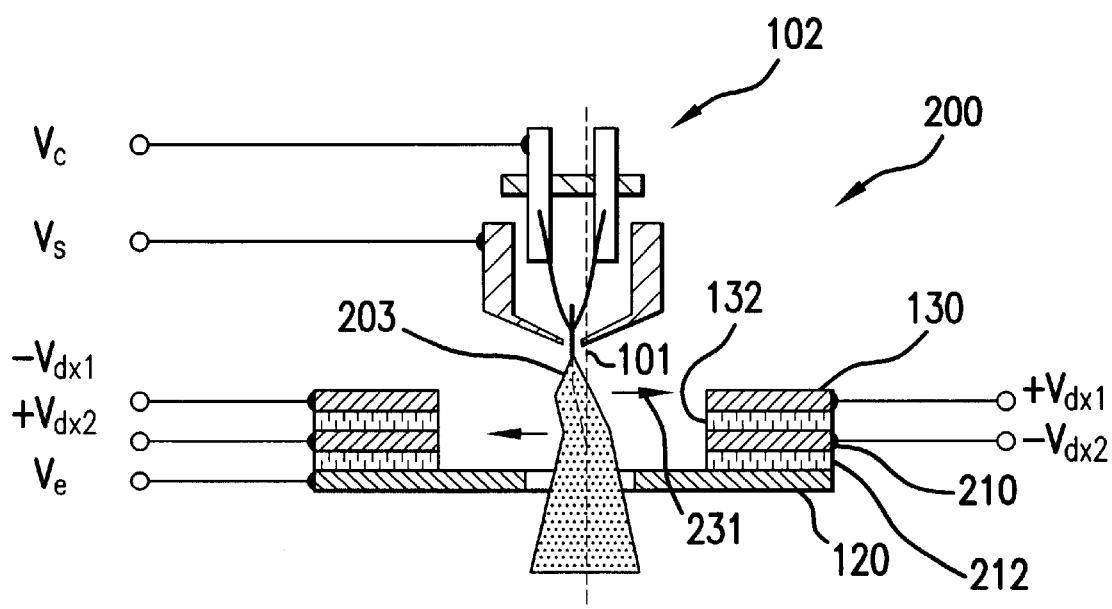
FIG. 6 shows a schematic cross sectional view of the correction of an electron beam produced by a misaligned field emission source in accordance with another embodiment of the present invention.

FIG. 6 shows a schematic cross sectional view of a misaligned field emission source 200 producing an electron beam 203 while centering electrodes 130 and a second set of centering electrodes 210 electrostatically align the electron beam 203 with the optical axis 101. As shown in FIG. 6, by application of centering potential on centering electrodes 130, a first electrostatic deflection field is generated (as indicated by arrow 231), which deflects the electron beam 203 so that it is in approximate alignment with the optical axis 101, i.e., the axis of the electron beam 203 passes through the center of the centering electrodes 210. The applied centering potentials are of equal amplitude and opposite polarity for opposite electrodes, i.e., ±Vdx1 and ±Vdy1 (which is applied to the centering electrode elements not shown in the cross sectional view of FIGS. 5 and 6).

By application of a second centering potential on the second set of centering electrodes 210, a second electrostatic deflection field is generated (as indicated by arrow 232), which deflects the electron beam 203 in a direction opposite to the direction that the electron beam 203 was deflected by centering electrodes 130. The second set of centering potentials are applied to opposite electrodes of the second set of centering electrodes 210, i.e., ±Vdx2 and ±Vdy2 (which is applied to the centering electrode elements not shown in the cross sectional view of FIGS. 5 and 6). As shown in FIG. 6, the orientations of the deflection fields generated by the two sets of deflection electrodes 130 and 210 are opposite in direction. The second set of potentials applied to centering electrodes 210 removes residual tilt created by centering electrodes 130, thereby deflecting the electron beam 203 to be approximately parallel with the optical axis 101, e.g., within 3 milliradians. A bias potential Vb may be applied to one or both sets of centering electrodes 130 and 210 so that a uniform extraction field is preserved if no electrostatic alignment is necessary.

Figure 7:
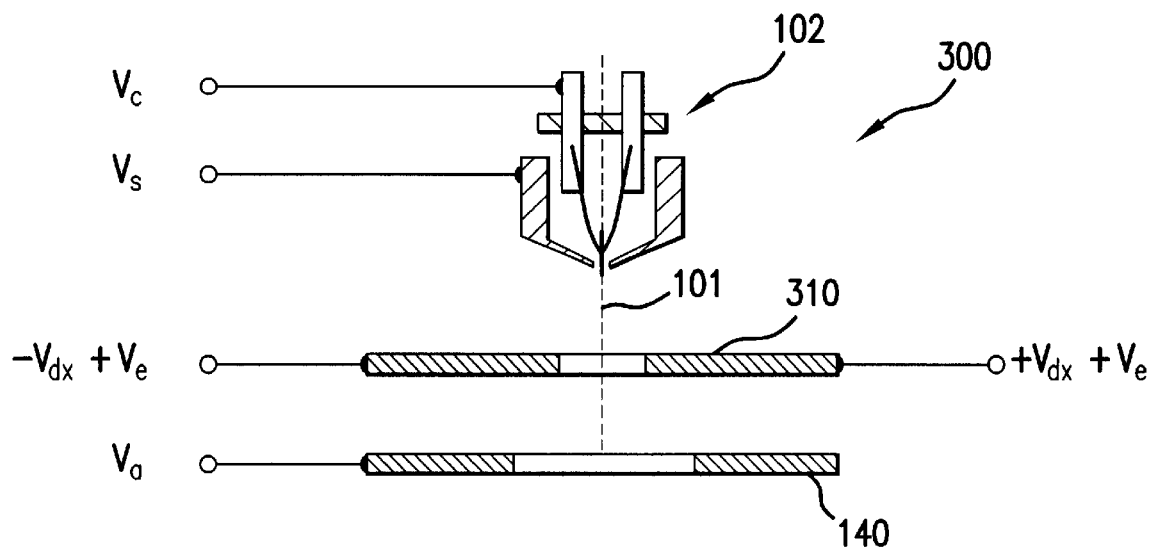
FIG. 7 shows a schematic cross sectional view of a field emission source with centering extraction electrodes in accordance with another embodiment of the present invention.

FIG. 7 shows a schematic cross sectional view of a field emission source 300 in accordance with another embodiment of the present invention. Field emission source 300 is similar to field emission source 100, shown in FIG. 2, like designated elements being the same, however, the extraction electrode 120 and the centering electrodes 130 are replaced with a centering extraction electrode 310.

Figure 8:
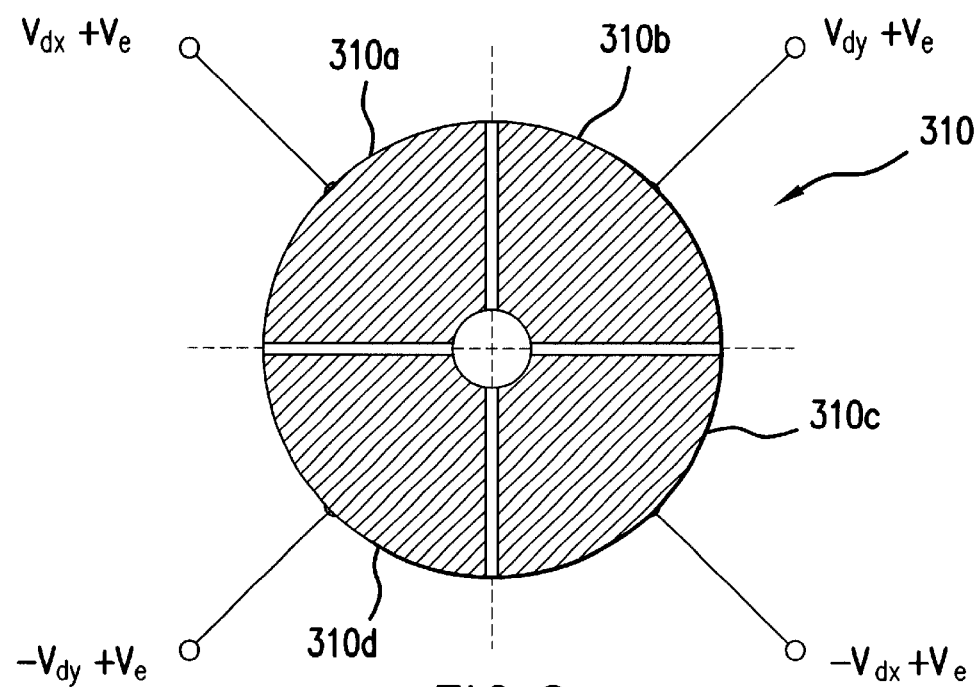
FIG. 8 shows a top view of the centering extraction electrodes from FIG. 7.

FIG. 8 shows a top view of the centering extraction electrode 310. As shown in FIG. 8, the centering extraction electrodes 310 is an extraction electrode split into a quadrupole arrangement having electrode elements 310a, 310b, 310c, and 310d. Of course, centering extraction electrode 310 may have a higher multipole arrangement if desired.

The centering extraction electrodes 310 operate as both the extraction electrode and the centering electrode. As shown in FIGS. 6 and 7, the extraction potential Ve and the centering potentials ±Vdx and ±Vdy are superimposed on the individual elements of the centering extraction electrodes 310.

The centering extraction electrodes 310 are fabricated using the same micromachining silicon technology used to fabricate lens components in a microcolumn, as is well understood by those skilled in the art. If desired, centering extraction electrodes 310 may be fabricated on a substrate (not shown), such as a silicon substrate, which may aid in the prevention of warping or mechanical breakdown of the centering extraction electrodes 310.

While the present invention has been described in connection with specific embodiments, variations of these embodiments will be obvious to those of ordinary skill in the art in light of the present disclosure. Thus, for example, while the present disclosure describes a field emission source in accordance with the present invention as including an electron emitter, it should be understood that any charged particle, including positive ions may be emitted and electrostatically aligned in accordance with the present invention. Therefore, the spirit and scope of the appended claims should not be limited to the foregoing description.

What is claimed is:

1. A source to emit a beam of charged particles, said source comprising:
    a charged particle emitter;
    an extraction electrode spaced-apart from said emitter and having an aperture, with said aperture being in superimposition with said emitter 1 and having a center, said extraction electrode defining an optical axis passing through said center; and
    a centering electrode disposed between said extraction electrode and said emitter, said centering electrode having an orifice lying in said optical axis.

2. The source of claim 1 wherein said orifice has a cross-sectional area associated therewith that is substantially greater than a cross-sectional area of said aperture and superimposes a portion of said extraction electrode, with said portion defining an extraction region, with said orifice being radially and symmetrically disposed about a point, with said point lying is said optical axis.

3. The source of claim 1, wherein said centering electrode includes a plurality of spaced-apart electrode elements disposed adjacent to said extraction electrode with an insulating layer being disposed between said extraction electrode and said electrode elements.

4. The source of claim 1, wherein said emitter includes a filament having a tip, with said filament being coupled to a first source of voltage and said extraction electrode being connected to a second source of voltage to produce an electric field proximate to said tip and direct said charged particles along a path toward said extraction electrode and said centering electrode is connected to third and fourth voltage sources to align said path, proximate to said extraction electrode, with said optical axis.

5. The source of claim 1, wherein said emitter includes a filament having a tip, with said filament coupled to a first source of voltage and said centering electrode includes a pair of spaced apart electrode elements, with said extraction electrode being connected to a second source of voltage to produce an electric field proximate to said tip to direct said charged particles along a path toward said extraction electrode and each electrode element of said pair being connected to a voltage supply having a polarity associated therewith that is opposite to the polarity of the voltage supply associated with the remaining electrode element of said pair.

6. The source of claim 1, wherein said emitter is selected from the group consisting essentially of a Schottky emitter and a cold-field emitter.

7. The source of claim 1, wherein said centering electrode includes a first set of four electrode elements disposed between said extraction electrode and said emitter, and a second set of four centering electrode elements disposed between said first set of four electrode elements and said emitter, with a first insulating layer being disposed between said first set of four electrode elements and said extraction electrode and a second insulating layer being disposed between said first and second sets of four electrode elements.

8. The source of claim 7, wherein said emitter includes a filament having a tip, with said filament being coupled to a first source of voltage and said extraction electrode being connected to a second source of voltage to produce an electric field proximate to said tip and direct said charged particles along a path toward said aperture, with each of said electrode elements of said first and second sets of four electrode elements being connected to a differing voltage supply to align said path with said optical axis.

9. A method of aligning a charged particle beam, produced by an emitter, with an optical axis defined by an extraction electrode, said method comprising:
 directing said charged particle beam over a path defined by an extraction field produced between said emitter and said extraction electrode;
 aligning said path with said optical axis by providing, between said emitter and said extraction electrode, an electrostatic deflection field.

10. The method of claim 9, wherein directing said charged particle beam further includes:
 applying a first voltage to said emitter; and
 applying a second voltage to said extraction electrode;
 wherein said extraction field is the difference between said first voltage and said second voltage.

11. The method of claim 9 further including providing a centering electrode having a plurality of centering electrode elements defining an orifice disposed in said optical axis, wherein directing said charged particle beam further comprises:
 applying a first centering voltage on one of said plurality of centering electrode elements disposed on a first side of said optical axis; and
 applying a second centering voltage on another of said plurality of centering electrode elements disposed on a second side of said optical axis, with said second side being opposite said first side.

12. The method of claim 9 further including providing a centering electrode having a first, second, third and fourth centering electrode elements, defining an orifice disposed in said optical axis, with said first electrode element being disposed opposite to said second electrode element and said third electrode element being disposed opposite to said fourth electrode element, wherein directing said charged particle beam further comprises:
 applying a first centering voltage on said first electrode element;
 applying a second centering voltage on said second centering electrode element;
 applying a third centering voltage on said third centering electrode element; and
 applying a fourth centering voltage on said fourth centering electrode element, with said first, second, third and fourth electrode elements being complanar.

13. The method of claim 9 wherein said extraction electrode includes an aperture having a center and aligning said path with said optical axis includes providing a deflection field having a magnitude associated therewith that is asymmetrically distributed about said center to direct said charged particle beam through said aperture.

14. The method of claim 9 further including providing a second electrostatic deflection field near said optical axis, wherein said second electrostatic deflection field deflects said charged particle beam to travel approximately parallel to said optical axis.

15. The method of claim 9, further comprising:
 providing an additional electrostatic deflection field near said optical axis, with said electrostatic deflection field deflecting said charged particle beam along a first direction and said additional electrostatic deflection field deflecting said charged particle beam along a second direction, opposite to said first direction.

16. A source to emit a beam of charged particles, said source comprising:
 a charged particle emitter; and
 an electrode system spaced-apart from said emitter to extract said beam of charged particles from said emitter to travel toward said electrode system, said electrode system defining an aperture in superimposition with said emitter and having a plurality of electrode segments to produce a deflection field between said electrode system and said emitter to guide said beam of charged particles through said aperture.

17. The source as recited in claim 16 wherein said plurality of electrode elements includes an extraction electrode defining said aperture and a centering electrode having a plurality of electrode segments, said centering electrode being disposed between said extraction electrode and said emitter and having an orifice centered about said optical axis, with a cross-sectional area of said orifice being substantially greater than a cross-sectional area of said aperture and superimposing a portion of said extraction electrode.

18. The source as recited in claim 16 wherein said electrode assembly includes an extraction electrode defining said aperture and a centering electrode defined by said plurality of electrode elements, with said plurality of electrode elements being disposed adjacent to said extraction electrode with an insulating layer being disposed between said extraction electrode and said electrode elements.

19. The source as recited in claim 17 wherein said emitter includes a filament having a tip, with said filament being coupled to a first source of voltage and said centering electrode is defined by a plurality of spaced-apart electrode segments, with said extraction electrode being connected to a second source of voltage to produce an electric field proximate to said tip and direct said charged particles along a path toward said extraction electrode, with said plurality of spaced-apart electrode segments being connected to differing voltage supplies to provide said deflection field, with said deflection field having a magnitude associated therewith that is asymmetrically distributed about said optical axis.

20. The source as recited in claim 19 wherein said plurality of electrode segments are arranged in first and second sets of four electrode segments, with said first set being disposed between said extraction electrode and said emitter and said second set being disposed between said first set said emitter, with a first insulating layer being disposed between said first set of four electrode segments and said extraction electrode and a second insulating layer being disposed between said first and second sets of four electrode segments.

* * * * *

UNITED STATES PATENT AND TRADEMARK OFFICE
CERTIFICATE OF CORRECTION

| | | |
|---|---|---|
| PATENT NO. | : 6,288,401 B1 | Page 1 of 1 |
| DATED | : September 11, 2001 | |
| INVENTOR(S) | : Tai-Hon P Chang et al. | |

It is certified that error appears in the above-identified patent and that said Letters Patent is hereby corrected as shown below:

<u>Column 1,</u>
Line 3, insert the following:

-- This invention was made with U.S. Government support under Contract No.: N00019-95-C-0059 awarded by the Department of the Navy. The Government has certain rights in this invention. --

Signed and Sealed this

Twenty-second Day of April, 2003

JAMES E. ROGAN
*Director of the United States Patent and Trademark Office*